US012733139B2

(12) United States Patent
Lehner et al.

(10) Patent No.: US 12,733,139 B2
(45) Date of Patent: Sep. 8, 2026

(54) ELECTRONICS HOUSING FOR POWER ELECTRONICS OF AN ELECTRIFIED POWERTRAIN

(71) Applicant: Dr. Ing. h.c. F. Porsche Aktiengesellschaft, Stuttgart (DE)

(72) Inventors: Robin Lehner, Frankfurt am Main (DE); Darius Abidi-Ashtiany, Cologne (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 240 days.

(21) Appl. No.: 18/617,864

(22) Filed: Mar. 27, 2024

(65) Prior Publication Data

US 2024/0341069 A1 Oct. 10, 2024

(30) Foreign Application Priority Data

Apr. 4, 2023 (DE) ..................... 10 2023 108 636.7

(51) Int. Cl.
*H05K 7/20* (2006.01)
*H05K 9/00* (2006.01)

(52) U.S. Cl.
CPC ..... *H05K 7/20927* (2013.01); *H05K 7/20236* (2013.01); *H05K 7/20272* (2013.01); *H05K 9/009* (2013.01)

(58) Field of Classification Search
CPC ........... H05K 7/20181; H05K 7/20145; H05K 9/0024; H05K 9/0039; H05K 9/0041;
(Continued)

(56) References Cited

U.S. PATENT DOCUMENTS 5,570,270 A * 10/1996 Naedel .................... G06F 1/183
361/748
6,776,706 B2 * 8/2004 Kipka ................ H05K 7/20181
55/467

(Continued)

FOREIGN PATENT DOCUMENTS

DE 102021202450 A1 9/2022
DE 102021204119 A1 10/2022

(Continued)

OTHER PUBLICATIONS

Zhang, Tian-song, Modularized Assembled Electromagnetic Shielding Cabinet, Mar. 15, 2024, Espacenet English Translation (Year: 2024).*

*Primary Examiner* — Michael A Matey
(74) *Attorney, Agent, or Firm* — LEYDIG, VOIT & MAYER, LTD.

(57) ABSTRACT

An electronics housing for power electronics of an electrified powertrain, including a receiving space for components of power electronics, an inlet into the receiving space for a temperature control fluid, an outlet into the receiving space for a temperature control fluid, and an electromagnetic compatibility (EMC) shielding element for protecting the power electronics and/or, conversely, surrounding components from possible electromagnetic interferences. The EMC shielding element also includes a particulate filter for the temperature control fluid flowing in via the inlet and flowing out via the outlet.

20 Claims, 2 Drawing Sheets

(58) Field of Classification Search
CPC ...... H05K 5/0213; H05K 7/00; H05K 7/1427; H05K 7/14329; H05K 7/1492; H05K 7/20927; H05K 7/20236; H05K 7/20272; H05K 9/0009; H05K 9/0026; H05K 9/0045; B01D 46/00; B01D 46/0008; B01D 46/0002; B60R 16/0239; G06F 1/182; G06F 1/181; G06F 1/206; G06F 1/26; G06F 1/263; H02M 1/44; H02M 7/003; H01M 50/249
See application file for complete search history.

(56) References Cited

U.S. PATENT DOCUMENTS 9,019,700 B2 * 4/2015 Ballantine ................. G06F 1/30 361/679.48
10,321,569 B1 * 6/2019 Butler .................... H05K 1/115
12,245,403 B2 * 3/2025 Lian ..................... H05K 5/0217
2003/0133283 A1 * 7/2003 Beihoff ................... H02M 1/44 361/818
2003/0151893 A1 * 8/2003 Meyer .................. H02M 7/003 361/689
2004/0098827 A1 * 5/2004 Oh ....................... A47L 9/1675 15/352
2007/0086158 A1 * 4/2007 Hartung ............. H05K 7/20563 361/690
2008/0174910 A1 * 7/2008 Hirono ............... G11B 33/1466 360/97.16
2012/0113590 A1 * 5/2012 Schwiebert ........ H05K 7/20172 165/120
2012/0300210 A1 * 11/2012 Dong ................. G01N 33/2841 356/437
2016/0176262 A1 * 6/2016 Pekarsky ............. H01M 10/60 165/104.33
2017/0027085 A1 * 1/2017 Held .................. H05K 7/20727
2017/0347496 A1 * 11/2017 Smith ....................... B03C 3/47
2020/0365522 A1 * 11/2020 Wang .................... H01L 23/427
2021/0274690 A1 * 9/2021 Cho ...................... H02M 1/327
2021/0337703 A1 * 10/2021 Lee ....................... H01L 23/473
2022/0328427 A1 * 10/2022 Coppola ................. H01L 25/18
2022/0359940 A1 11/2022 Schmitt

FOREIGN PATENT DOCUMENTS

DE 102021113090 A1 11/2022
DE 102021204696 A1 11/2022

* cited by examiner

ELECTRONICS HOUSING FOR POWER ELECTRONICS OF AN ELECTRIFIED POWERTRAIN

CROSS REFERENCE TO RELATED APPLICATIONS

This application claims benefit to German Patent Application No. DE 10 2023 108 636.7, filed on Apr. 4, 2023, which is hereby incorporated by reference herein.

FIELD

The invention relates to an electronics housing for power electronics of an electrified powertrain, as well as to a motor vehicle with such an electronics housing.

BACKGROUND

So-called EMC shielding is used to ensure that power electronics in a motor vehicle can be operated in a permitted and/or technically safe manner, i.e., without other devices being interfered with by electrical or electromagnetic effects. Thus, a so-called electromagnetic compatibility [EMC] can be ensured. According to the European EMC Directive, EMC is preferably to be understood as the ability of an apparatus, installation or system to be operable in the electromagnetic environment without itself causing electromagnetic interference, which would impair or be unacceptable for (all) devices present in this environment, but also conversely to protect the device in question from such interfering EMC influences.

For example, it is known to use a sheet or grid that functions as Faraday cage. In so doing, it must be ensured that a virtually tight seal is created. Therefore, precisely adapted sheets or grids may need to be used for each configuration.

SUMMARY

In an embodiment, the present disclosure provides an electronics housing for power electronics of an electrified powertrain, comprising a receiving space for components of power electronics, an inlet into the receiving space for a temperature control fluid, an outlet into the receiving space for a temperature control fluid, and an electromagnetic compatibility (EMC) shielding element for protecting the power electronics and/or, conversely, surrounding components from possible electromagnetic interferences. The EMC shielding element also comprises a particulate filter for the temperature control fluid flowing in via the inlet and flowing out via the outlet.

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

DETAILED DESCRIPTION

Figure 1:
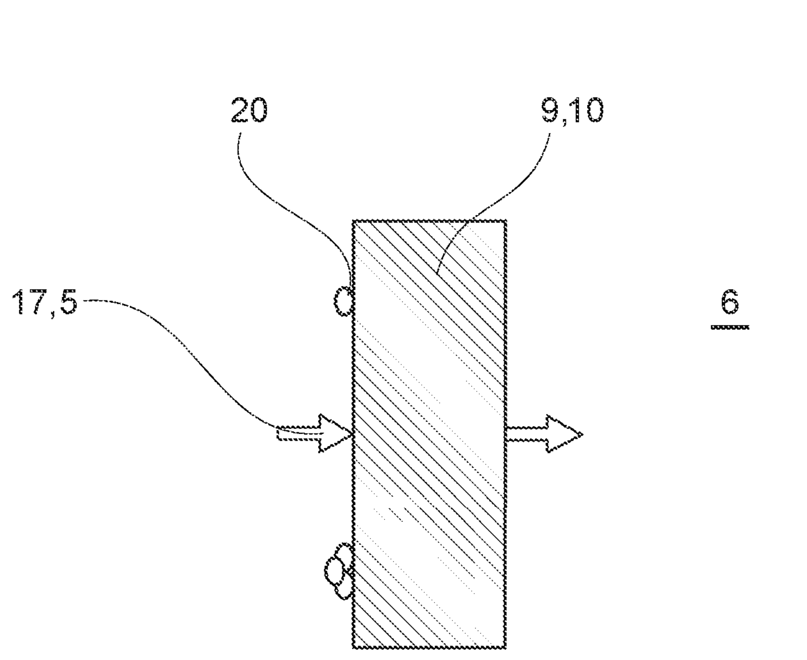
FIG. 1 illustrates a schematic side cross-sectional view of an EMC shielding element.

In an embodiment, the present invention provides an electronics housing that at least partially overcomes the disadvantages known from the prior art. The features of disclosed embodiments can be combined in any technically meaningful manner, for which purpose it is also possible to consult the explanations from the following description and features from the figures, which comprise additional configurations of embodiments of the invention.

An embodiment of the invention relates to an electronics housing for power electronics of an electrified powertrain, comprising at least the following components:

- a receiving space for components of power electronics;
- an inlet in the receiving space for a temperature control fluid;
- an outlet in the receiving space for a temperature control fluid; and
- an EMC shielding element for protecting the power electronics and/or, conversely, surrounding components from possible electromagnetic interferences.

The electronics housing is characterized in particular in that the EMC shielding element also comprises a particulate filter for the temperature fluid flowing in via the inlet and flowing out via the outlet.

Unless explicitly stated otherwise, ordinal numbers are used in the preceding and the following description only for the purposes of clear distinction and do not reflect any order or ranking of the designated components. An ordinal number greater than one does not imply that another such component has to necessarily be present.

The electronics housing is a separate housing or part of a larger housing for housing a plurality of devices or units. In the latter case, for example, the electronics housing is a (one-piece or multi-piece) housing component that does not individually enclose a space. Rather, the electronics housing is then a housing half, whereby it should be noted that the term housing half is not limited to the fact that there are exactly two parts. The electronics housing comprises a receiving space in which power electronics can be accommodated, preferably at least pre-assembled. For this purpose, for example, bars and/or supports for the components of the power electronics are arranged in the receiving space or define the shape of the receiving space.

The power electronics (for example, a pulse inverter for an electrical traction machine of a motor vehicle) are to be temperature controlled, for example primarily cooled. An inlet and an outlet for a temperature control fluid are provided for this purpose. The temperature control fluid is adapted to configured to flow over at least areas of the power electronics with a very good heat transfer. It should be noted that the inlet and/or outlet are not necessarily each formed as a single opening and/or entering in a single region of the receiving space. For example, the inlet and/or outlet each comprise a plurality of openings and/or a plurality of locations where the temperature control fluid can flow into or out of the receiving space, for example, flowing from or towards various other components of a common thermal circuit.

Furthermore, an EMC shielding element is provided comprising an electrically conductive material, preferably made of an electrically conductive material. In an embodiment, the EMC shielding element is configured in a conventional manner to provide at least partial EMC shielding. Preferably, the EMC shielding element is the only element that provides EMC shielding. The EMC shielding element is designed in one piece or in multiple pieces.

It is now provided here that the EMC shielding element is also used as a particulate filter for the temperature control fluid. For this purpose, the EMC shielding element has a significantly smaller maximum flow opening, in contrast to previously known EMC shielding elements. For example, particles that may pass through this particulate filter have a (smallest) diameter of less than or equal to 600 μm [six hundred micrometers]. For example, the fineness of the particulate filter is determined according to the desired purity of the temperature control fluid, for example according to clean room regulations.

It should be noted that the particulate filter or its property is formed by the EMC shielding element overall or is only present in regions. Furthermore, it should be noted that the temperature control fluid is forced through the particulate filter as it flows in from the inlet and out via the outlet; the particulate filter is therefore arranged in the electronics housing such that the temperature control fluid is completely filtered between the inlet and the outlet and is filtered by the outlet at the latest. Preferably, the particulate filter is arranged such that the temperature control fluid is already filtered before it can enter into direct heat exchange with the power electronics accommodated in the receiving space or a heat transfer wall arranged in between.

In an advantageous embodiment, the use of such an EMC shielding element with particulate filter means that no (further) separate particulate filter is necessary for the temperature control fluid. Alternatively or additionally, the particulate filter here produces a particular purity grade with regard to the number of particles and/or particle size.

In a preferred embodiment, the particulate filter is configured in such a way that the temperature control fluid is deflected at least once in its main flow direction by the EMC shielding element. In other words, a path of the temperature control fluid between an inlet into and an outlet from the particulate filter is not straight, but preferably at least one deflection of more than 90° [ninety degrees of 360°], particularly preferably multiple times (for example, back and forth), is formed in this path.

According to an aspect, impingement cooling for the temperature control fluid can be achieved by means of the EMC shielding element with the particulate filter. This improves heat transfer between the temperature control fluid and the EMC shielding element compared to an EMC shielding element with a low flow resistance, for example with cooling fins aligned along a main flow direction.

It is further provided in an advantageous embodiment of the electronics housing that the EMC shielding element comprises or is formed of a metallic material, wherein the metallic material preferably comprises copper.

In an embodiment, the EMC shielding element comprises such an (electrically conductive) material in which a plastic with embedded electrically conductive material, for example a metal or graphene (for example in the form of embedded carbon fibers) is used. The advantage of such a plastic component is that it is cost-effective for serial production and can also be individually adapted to a configuration of the electronics housing or the power electronics to be accommodated or other parameters at low cost.

In an embodiment, the electrically conductive material comprises at least one ceramic, preferably an oxide ceramic or technical ceramic, which is electrically conductive, for example, by itself or by means of a suitable filler, for example a metal or graphene (for example in the form of embedded carbon fibers).

In an embodiment, the EMC shielding element is formed, preferably completely, from a metallic material, for example from a sheet material, lattice material or mesh material. Such a material is cost-effective and also easy to (cold) form and thus can also be individually adapted to a specific configuration at low cost.

In a preferred embodiment, the metallic material is copper or a copper alloy. Copper has the advantage that it has both a very high electrical conductivity (good for shielding) as well as a very high thermal conductivity and a high heat transfer coefficient and optionally a comparatively high heat capacity (good for tempering the temperature control fluid).

It is further provided in an advantageous embodiment of the electronics housing that the particulate filter of the EMC shielding element is formed from a porous material, preferably from an open-porous foam material.

By means of (open) porous material, the filter effect is already provided by the material itself in a simple manner. For example, the porous material is a sinter material. It is necessary to have at least a portion of the pores formed such that a channel through which the temperature control fluid can flow is formed through the porous material. The advantage here is that from a suitable material thickness it is almost impossible for a straight channel to be formed. Particles are thus reliably retained.

In a preferred embodiment, an open-porous foam material is used. Such foam material has the additional advantage that it can be easily (cold) formed. Particularly preferably, the open-porous foam material is formed from copper or a copper alloy. In an embodiment, the entire EMC shielding element is formed from the open-porous foam material.

It is further provided in an advantageous embodiment of the electronics housing that the particulate filter of the EMC shielding element is formed from a grid, preferably from an expanded metal.

A grid is a particularly cost-effective material and already has the necessary surface electrical conductivity of an EMC shielding element. By selecting an appropriate size of the grid openings, a particulate filter is formed. In an embodiment, a plurality of grids are inserted one behind the other, which have decreasing opening sizes (in the main direction of flow) and/or are arranged offset to each other such that a smaller opening size is produced in the main flow direction.

In a preferred embodiment, the grid is formed from an expanded metal, which is particularly cost-effective and can also be easily (cold) formed.

It is further provided in an advantageous embodiment of the electronics housing that the material of the particulate filter, preferably of the entire EMC shielding element, is plastically deformable in a non-destructive manner.

In an embodiment, the particulate filter or the (possibly entire) EMC shielding element can be easily (preferably cold) formed. This means that the material can be shaped to suit individual requirements. For example, a fitter can make an individual adjustment in-situ during assembly to ensure effective EMC shielding and a forced flow through the particulate filter. It should be noted that, under certain circumstances, an individual or regularly required adjustment during assembly may also comprise an elastic deformation portion, wherein (elastic) deformation is prevented, for example, in a materially bonded, force-fit and/or a form-fit manner.

It is further provided in an advantageous embodiment of the electronics housing that the EMC shielding element comprises at least one of the following structures:

a corrugation;

a rib;

a web; and a grid.

In an embodiment, the structures mentioned herein are each advantageous for mechanical stability of the EMC shielding element and/or for improved heat transfer (compared to an embodiment without this structure). Preferably, the respective structure is formed from the material of the EMC shielding element, for example by corresponding (sheet) reshaping of a grid to form a corrugation and/or at least one rib. It should be noted that a rib is generally considered to be a smaller structure and/or simpler structure compared to a web and/or, unlike a (connecting) web, is considered to have no connection to another component. Alternatively or additionally, such a structure is joined separately with the EMC shielding element.

It should be noted that in an advantageous embodiment, the electronics housing itself has external cooling elements, for example ribs or webs, and the EMC shielding element is coupled to the electronics housing in a thermally conductive manner such that heat can be exchanged between the EMC shielding element and the electronics housing by means of heat conduction or can be stored in the electronics housing.

Furthermore, in an advantageous embodiment of the electronics housing, it is further provided that the temperature control fluid that can be fed into the electronics housing via the inlet and outlet is an electrically insulating fluid, preferably an oil, for immersion temperature control.

In an embodiment, the power electronics, or at least an area thereof, is in direct contact with the (electrically insulating) temperature control fluid, i.e., a so-called immersion temperature control, despite possible electrical conductivity (e.g., in the case of a fault in an electrical insulation measure). This achieves a very high level of heat transfer efficiency. However, no (excessively large) electrically conductive particles are to be present in such a temperature control fluid. This is prevented by means of the EMC shielding element as provided herein. It should be noted that in an embodiment, although the power electronics itself accommodated in the electronics housing are preferably protected from (excessively large) particles, alternatively only one device or unit located downstream in a common thermal circuit is protected from (excessively large) particles.

Preferably, the temperature control fluid is in the form of oil and is guided in a liquid phase in the electronics housing, particularly preferably in the entire thermal circuit.

According to an aspect, a motor vehicle is provided comprising at least the following components:

at least one preferably high-voltage operated electrical, particularly preferably battery-electric operated, traction machine, power electronics for the traction machine and at least one propulsion wheel, which can be driven by means of the traction machine to propel the motor vehicle, wherein the power electronics, preferably comprising a pulse inverter, are shielded and enclosed with temperature control in an electronics housing according to an embodiment according to the above description.

The motor vehicle provided herein comprises a traction machine, for example an electric motor, or a plurality of traction machines, for example designed as a hybrid or purely electric, each with an electric motor and/or a wheel hub drive in at least one of the drive wheels of the motor vehicle on a vehicle axle. Preferably, the motor vehicle is battery-electric by means of a high-voltage battery with electrical energy for propulsion. Alternatively or additionally, (further) components requiring power electronics with temperature control are provided in the motor vehicle. By means of the at least one traction machine, propulsion of the motor vehicle can be generated via the drive wheels, usually two or four. By means of the EMC shielding element in the electronics housing of the (at least one) power electronics unit, the shielding of electromagnetic radiation and any interference that may result is achieved in accordance with the regulations and/or technical requirements.

This also creates a safeguard against (excessively large) particles being present in the temperature control fluid or reaching critical areas of the power electronics and/or in a thermal circuit. In a preferred embodiment, it is not necessary to arrange a further particulate filter upstream of the electronics housing or elsewhere in the thermal circuit.

For example, this means that the temperature control fluid does not need to be replaced or needs to be replaced less often, preferably extending or eliminating a maintenance cycle for the relevant thermal circuit of the motor vehicle and/or the power electronics.

Furthermore, in an advantageous embodiment of the motor vehicle it is provided that the power electronics can have immersion temperature control by means of the inlet and outlet in the electronics housing, wherein the temperature control fluid is preferably used in a common thermal circuit for the traction machine and/or other components of the powertrain of the motor vehicle.

The advantage of the particulate filter, which is also covered by the EMC shielding element for the power electronics in the electronics housing, is particularly great in the case of immersion temperature control, because this prevents (excessively large) particles from adhering or wedging to a device or unit that is directly exposed to the flow and also (in the case of electrically conductive particles) reliably prevents an electrical fault conductor or a short circuit.

When using a thermal circuit for a plurality of components of the motor vehicle, such as the traction machine and/or a high voltage battery, an on-board charger, a chiller, an electric heater, a step-up converter and/or other components, it is advantageous, on the one hand, if the power electronics in question, such as a pulse inverter for an electrical traction machine, is protected from any particles from the thermal circuit or other components that are to have their temperature controlled, and it is also advantageous, on the other hand, if a necessary particulate filter can be dispensed with by already integrating this function into the (at least one) EMC shielding element.

The above-described embodiments of the invention are discussed in detail in the following in the context of the relevant technical background with reference to the accompanying drawings which show preferred embodiments. Embodiments of the invention are not limited in any way by the purely schematic drawings, whereby it should be noted that the drawings are not true to scale and are not suitable for defining dimensional relationships.

FIG. 1 shows a schematic side sectional view of an EMC shielding element 8. The EMC shielding element 8 comprises an electrically conductive material and is designed in such a way to achieve a suitable EMC shielding. In addition, the EMC shielding element 8 has a material structure by means of which particles 20 are filtered out of a temperature control fluid 6 flowing through the EMC shielding element 8 in a flow direction indicated by arrows (for example, using the main flow direction 17).

Figure 2:
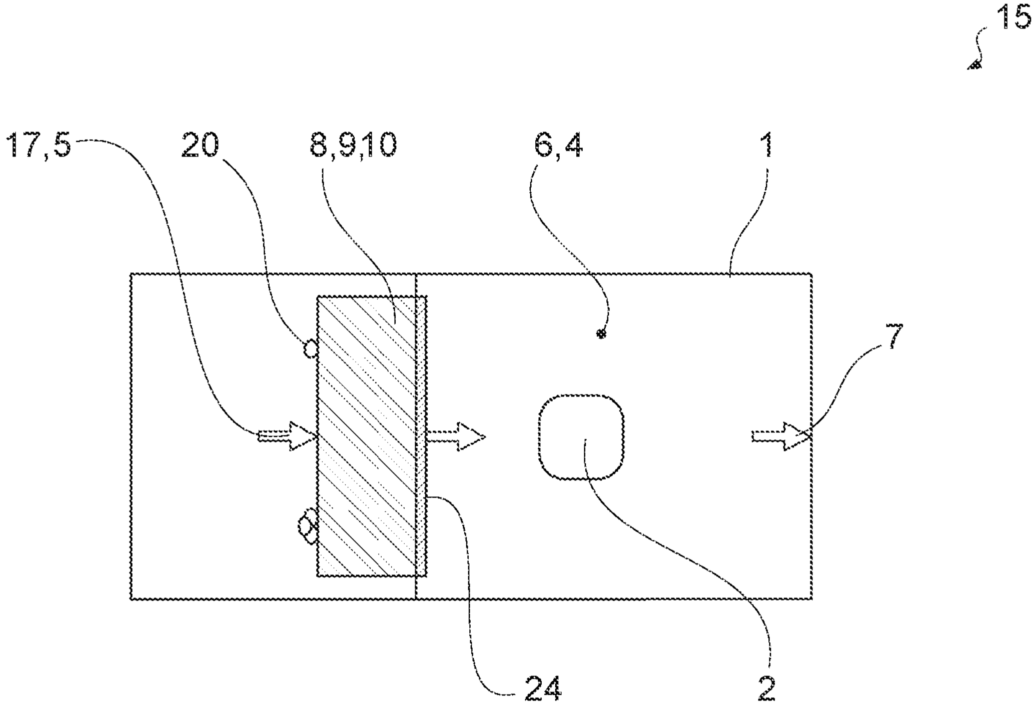
FIG. 2 illustrates a schematic side cross-sectional view of an electronics housing with power electronics and with an EMC shielding element.

FIG. 2 shows a schematic side sectional view of an electronics housing 1 with power electronics 2 (for example a pulse inverter 15) and with an EMC shielding element 8, both (optionally) within the receiving space 4. For example, the electronics housing 1 and the power electronics 2, as well as the temperature control fluid 6, are configured for immersion temperature control, i.e., for direct contact between (potentially electrically conductive elements) of the power electronics 2 and the temperature control fluid 6. On the left in the illustration, an inlet 5 is formed for the temperature control fluid 6 and, on the right in the illustration, an outlet 7, so that a corresponding main flow direction 17 (as indicated by the arrows) is formed in the electronics housing 1. The EMC shielding element 8 is arranged relative to the power electronics 2 such that the power electronics 2 are shielded as desired. For the sake of simplicity, reference is made in this respect to the general technical knowledge and the reference in the previous description to the advantage of formability. In addition, the EMC shield element 8 or the particulate filter 9 is (optionally) arranged here, such that the power electronics 2 are protected from potentially incoming (excessively large) particles 20 carried along with the temperature control fluid 6 (in the main flow direction 17 indicated by arrows) by retaining particles 20 from the particulate filter 9, as indicated herein in the sketch. The particulate filter 9 is made of a foam material 10 purely by way of example.

According to one (optional) embodiment, the EMC shielding element 8 also comprises a plurality of fins for an improved heat transfer between the EMC shielding element 8 and the temperature control fluid 6. Independently thereof, a (optional) rib is shown on the outside of the electronics housing 1 by means of which a good heat transfer from the electronics housing 1 to a current environment and/or to surrounding components is created.

Figure 3:
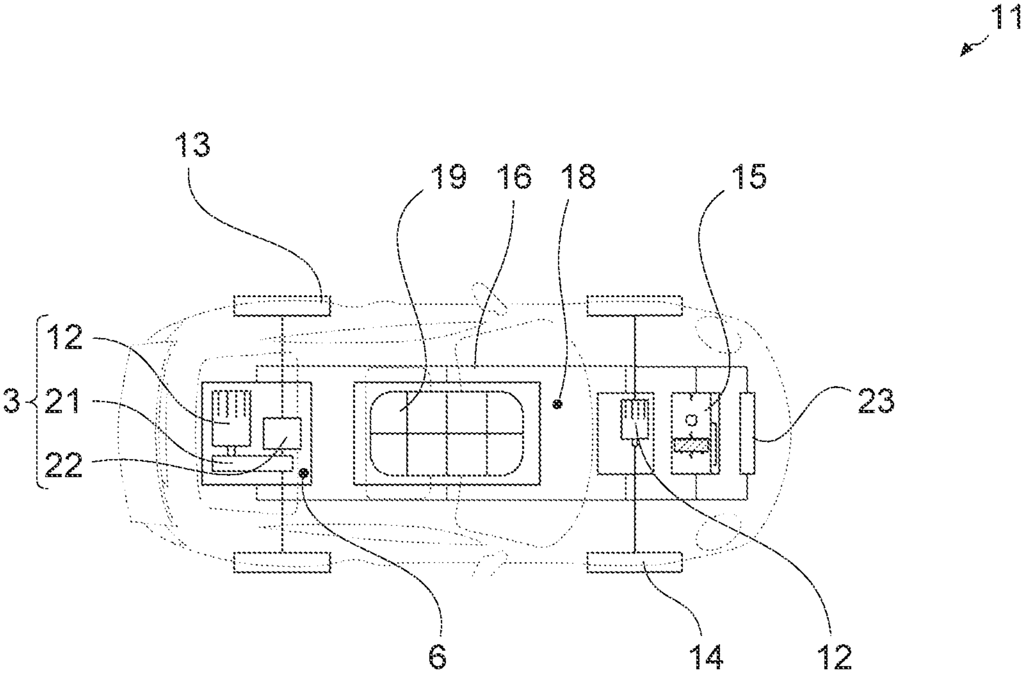
FIG. 3 illustrates a schematic plan view of a motor vehicle with a thermal circuit.

FIG. 3 shows a schematic top view of a motor vehicle 11 with a thermal circuit 16 for (optionally and not exclusively) its powertrain 3. The motor vehicle 11 is provided for transporting at least one passenger and/or goods and comprises a transport compartment 18 for this purpose, in this case mainly a passenger cabin, for example. The motor vehicle 11 is driven via the front drive wheels 13 and the rear drive wheels 14 by means of the torque from the respective (in this case optionally electric) traction machine 12, wherein one traction machine 12 is arranged on the rear axle and a second traction machine 12 is arranged on the front axle, which can be supplied with electric power by a high-voltage battery 19, designed here as a traction battery. The torque of the respective electrical traction machine 12 (with the front optionally coaxial and the rear optionally axle-parallel) can be transferred to the drive wheels 13,14 via a transmission 21 and a differential 22 (only indicated at the rear). The drive wheels 13,14 are configured to propel the motor vehicle 11. A thermal circuit 16 with a heat exchanger 23 is provided for temperature control of the units of the drive and the transport compartment 18. A pulse inverter 15 with an EMC shielding element 8 is shown purely by way of example, which also comprises (preferably the only) particulate filter 9 for the temperature fluid 6 of the thermal circuit 16.

In addition to the shielding function, the EMC shielding element provided here also forms a particulate filter.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Electronic housing
2 Power electronics
3 Powertrain
4 Receiving space
5 Inlet
6 Temperature control fluid
7 Outlet
8 EMC shielding element
9 Particulate filter
10 Foam material
11 Motor vehicle
12 Traction machine
13 Rear drive wheel
14 Front drive wheel
15 Pulse inverter
16 Thermal circuit
17 Main flow direction
18 Transport compartment
19 High-voltage battery
20 Particles
21 Transmission
22 Differential
23 Heat exchanger
24 Cooling fin

The invention claimed is:

1. An electronics housing for power electronics of an electrified powertrain, comprising:

a receiving space for components of the power electronics;

an inlet into the receiving space configured to permit a temperature control fluid to flow into the receiving space;

an outlet from the receiving space configured to permit the temperature control fluid to flow out of the receiving space; and an electromagnetic compatibility (EMC) shielding element arranged in the receiving space and configured to protect the power electronics from electromagnetic interferences, wherein the receiving space at least partially defines a path for the temperature control fluid to flow from the inlet to the outlet, and wherein the EMC shielding element comprises an electrically conductive material having a structure configured as a particulate filter, which is arranged in the path.

2. The electronics housing of claim 1, wherein the EMC shielding element is formed from the electrically conductive material which is a metallic material.

3. The electronics housing according to claim 1, wherein the particulate filter of the EMC shielding element is formed from a porous material.

4. The electronics housing according to claim 1, wherein the particulate filter of the EMC shielding element is formed as a grid.

5. The electronics housing according to claim 1, wherein material of the particulate filter is plastically deformable in a non-destructive manner.

6. The electronics housing according to claim 1, wherein the EMC shielding element comprises at least one of a corrugation, a rib, a web, or a grid.

7. The electronics housing according to claim 1, wherein the temperature control fluid, which can be fed into the electronics housing via the inlet and flow out of the electronics housing via the outlet, is an electrically insulating fluid for immersion temperature control.

8. A motor vehicle comprising:

at least one high-voltage operated electrical traction machine;

power electronics for the high-voltage operated electrical traction machine; and at least one propulsion wheel, which can be driven by the high-voltage operated electrical traction machine to propel the motor vehicle, wherein the power electronics are shielded and enclosed with temperature control in the electronics housing according to claim 1.

9. The motor vehicle according to claim 8, wherein the power electronics can have immersion temperature control via the temperature control fluid flowing in via the inlet and flowing out via the outlet in the electronics housing.

10. The electronics housing of claim 2, wherein the metallic material comprises copper.

11. The electronics housing according to claim 3, wherein the porous material is an open-porous foam material.

12. The electronics housing according to claim 4, wherein the particulate filter of the EMC shielding element is formed from an expanded metal.

13. The electronics housing according to claim 5, wherein the material of the entire EMC shielding element is plastically deformable in a non-destructive manner.

14. The electronics housing according to claim 7, wherein the temperature control fluid is an oil.

15. The motor vehicle according to claim 9, wherein the temperature control fluid is used in a common thermal circuit for the high-voltage operated electrical traction machine and/or other components of the electrified powertrain of the motor vehicle.

16. The electronics housing according to claim 1, wherein the electrically conductive material arranged in the material structure to form the particulate filter comprises a flow opening formed from the electrically conductive material and arranged upstream of the outlet, wherein the flow opening is configured to receive the temperature control fluid and deflect the temperature control fluid away from a straight path from the inlet to the outlet.

17. A motor vehicle, comprising:

at least one high-voltage operated electrical traction machine;

power electronics for the high-voltage operated electrical traction machine; and at least one propulsion wheel, which can be driven by the high-voltage operated electrical traction machine to propel the motor vehicle, wherein the power electronics are shielded and enclosed with temperature control in an electronics housing for the power electronics of an electrified powertrain, the electronics housing comprising:

a receiving space for components of the power electronics;

an inlet into the receiving space for a temperature control fluid;

an outlet into the receiving space for the temperature control fluid; and an electromagnetic compatibility (EMC) shielding element for protecting the power electronics and/or, conversely, surrounding the components from possible electromagnetic interferences, wherein the EMC shielding element also comprises a particulate filter arranged in a path of the temperature control fluid flowing in via the inlet and flowing out via the outlet.

18. The motor vehicle according to claim 17, wherein the power electronics can have immersion temperature control via the temperature control fluid flowing in via the inlet and flowing out via the outlet in the electronics housing.

19. The motor vehicle according to claim 18, wherein the temperature control fluid is used in a common thermal circuit for the high-voltage operated electrical traction machine and/or other components of the electrified powertrain of the motor vehicle.

20. An electronics housing for power electronics of an electrified powertrain, comprising:

a receiving space for components of the power electronics;

an inlet into the receiving space for a temperature control fluid;

an outlet into the receiving space for the temperature control fluid; and an electromagnetic compatibility (EMC) shielding element for protecting the power electronics and/or, conversely, surrounding components from possible electromagnetic interferences, wherein the EMC shielding element comprises a particulate filter arranged in a path of the temperature control fluid flowing in via the inlet and flowing out via the outlet, wherein the temperature control fluid which can be fed into the electronics housing via the inlet and flow out of the electronics housing via the outlet, is an electrically insulating fluid for immersion temperature control, wherein the temperature control fluid is an oil.

* * * * *